(12) United States Patent
Ervin et al.

(10) Patent No.: US 8,441,048 B2
(45) Date of Patent: May 14, 2013

(54) HORIZONTALLY DEPLETED METAL SEMICONDUCTOR FIELD EFFECT TRANSISTOR

(75) Inventors: Joseph E. Ervin, Spring Grove, IL (US); Trevor John Thornton, Fountain Hills, AZ (US)

(73) Assignee: Arizona Board of Regents for and on behalf of Arizona State University, Scottsdale, AZ (US)

( * ) Notice: Subject to any disclaimer, the term of this patent is extended or adjusted under 35 U.S.C. 154(b) by 373 days.

(21) Appl. No.: 12/677,066

(22) PCT Filed: Sep. 12, 2008

(86) PCT No.: PCT/US2008/076169
§ 371 (c)(1),
(2), (4) Date: Mar. 8, 2010

(87) PCT Pub. No.: WO2009/036273
PCT Pub. Date: Mar. 19, 2009

(65) Prior Publication Data
US 2010/0320508 A1    Dec. 23, 2010

Related U.S. Application Data

(60) Provisional application No. 60/971,778, filed on Sep. 12, 2007.

(51) Int. Cl.
*H01L 21/02*    (2006.01)
*H01L 29/66*    (2006.01)

(52) U.S. Cl.
USPC ........... 257/284; 257/260; 257/270; 257/281; 257/E29.265; 257/E29.319

(58) Field of Classification Search .................. 257/260, 257/284, E29.265, E29.319, 267, 281, E29.321, 257/E29.178, E21.186, E21.374, 282, 270; 438/176, 438/177
See application file for complete search history.

(56) References Cited

U.S. PATENT DOCUMENTS

| | | | |
|---|---|---|---|
| 5,899,710 A | 5/1999 | Mukai | |
| 6,118,161 A | 9/2000 | Chapman et al. | |

(Continued)

FOREIGN PATENT DOCUMENTS

WO    2004/068589 A1    8/2004

OTHER PUBLICATIONS

Lu, Jian-Qiang et al., "Heterodimensional Field Effect Transistors for Ultra Low Power Applications," Technical Digest of the Gallium Arsenide Integrated Circuits (GAAS IC) Symposium, pp. 187-190, Nov. 1, 1998, New York, NY, IEEE.

(Continued)

*Primary Examiner* — Daniel Luke
(74) *Attorney, Agent, or Firm* — Withrow & Terranova, P.L.L.C.

(57) ABSTRACT

The present invention provides a horizontally depleted Metal Semiconductor Field Effect Transistor (MESFET). A drain region, a source region, and a channel region are formed in the device layer such that the drain region and the source region are spaced apart from one another and the channel region extends between the drain region and the source region. First and second gate contacts are formed in the device layer on either side of the channel region, and as such, the first and second gate contacts will also reside between opposing portions of the source and drain regions. With this configuration, voltages applied to the first and second gate contacts effectively control vertical depletion regions, which form on either side of the channel region.

21 Claims, 20 Drawing Sheets

U.S. PATENT DOCUMENTS

| | | |
|---|---|---|
| 6,236,070 B1 | 5/2001 | Griffin et al. |
| 2002/0130354 A1 | 9/2002 | Sekigawa et al. |
| 2003/0193065 A1 | 10/2003 | Fried et al. |
| 2004/0256647 A1* | 12/2004 | Lee et al. .................. 257/289 |
| 2006/0172497 A1* | 8/2006 | Hareland et al. ............. 438/286 |

OTHER PUBLICATIONS

International Search Report for PCT/US2008/076169, mailed Feb. 26, 2009.

* cited by examiner

HORIZONTALLY DEPLETED METAL SEMICONDUCTOR FIELD EFFECT TRANSISTOR

This application is a 35 USC 371 national phase based on PCT/US08/76169 filed Sep. 12, 2008, which claims the benefit of U.S. provisional application Ser. No. 60/971,778 filed Sep. 12, 2007, the disclosure of which are incorporated herein by reference in their entireties.

FIELD OF THE INVENTION

The present invention relates to field effect transistors, and in particular to a horizontally depleted Metal Semiconductor Field Effect Transistor (MESFET).

BACKGROUND OF THE INVENTION

Metal Semiconductor Field Effect Transistors (MESFETs) are becoming more ubiquitous in modern electronics and are particularly applicable in high speed and high voltage analog and digital electronics applications. As illustrated in FIG. 1A, a typical MESFET 10 includes a channel region 12 that extends between a source region 14 and a drain region 16. A Schottky gate structure 18 includes a gate contact 20 that resides over the channel region 12 and between a source contact 24 that resides over the source region 14 and a drain contact 22 that resides over the drain region 16. The source region 14 and the associated source contact 24 are collectively referred to as a source 28. The drain region 16 and the associated drain contact 22 are collectively referred to as a drain 26. In a silicon-on-insulator (SOI) process, the channel region 12, the source region 14, and the drain region 16 are formed in a silicon layer 30 that resides over an insulator layer 32, which is formed from a buried oxide or like dielectric, and an underlying substrate 34, which may also be formed from silicon. In a typical n-channel MESFET 10, the source region 14 and the drain region 16 are generally heavily doped with N-type material, the channel region 12 is either unintentionally doped or lightly doped with N-type material, and the substrate 34 is doped with either P-type or N-type material. A depletion layer (not illustrated) that naturally forms in the channel region 12 effectively controls the flow of current between the drain 26 and the source 28. In operation, varying the voltage applied to the gate contact 20 varies the thickness of the depletion layer, and thus varies the flow of current between the drain 28 and the source 26.

In most Complementary Metal Oxide Semiconductor (CMOS) processes, the source, gate, and drain contacts 22, 20, and 24 are often formed from a silicide. Silicide source and drain contacts are formed by applying a reactive metal, such as cobalt, nickel, or the like, on the silicon layer 30 where contacts are desired. The metal reacts with the silicon to form a silicide contact. The reaction effectively consumes a portion of the silicon such that the resulting silicide contact extends into the silicon layer 30. Typically, the thickness $t_s$ of the silicon layer 30 is generally at least 200 nanometers (nm) thick. Notably, the silicide gate contact 20 consumes a significant fraction of the silicon layer 30 that resides below the gate contact 20. As a result, the effective thickness $t_c$ of the channel region 12 is substantially less than the thickness $t_s$ of the silicon layer 30. When the thickness $t_s$ of the silicon layer 30 is 200 nm or more, the effective thickness $t_c$ of the channel region 12 is sufficiently thick to allow current to flow between the drain 28 and the source 26, as well as form and control an effective depletion layer in response to varying a voltage applied to the gate contact 20 to control the current flow in the channel region 12.

Unfortunately, the continuous pressure to reduce component sizes and increase integration has led to a continual reduction in the thickness of the silicon layer 30 in which MESFETs and other devices are formed. A MESFET 10 is illustrated in FIG. 1B, wherein the thickness $t_s$ of the silicon layer 30 has been substantially reduced with respect to that illustrated in FIG. 1A. As is clear from the illustration, the thickness $t_c$ of the channel region 12 is very small.

A thin channel region 12 poses two major manufacturing and design issues. First, when the drain, gate, and source contacts 22, 20, and 24 are silicide contacts, the process of forming the silicide is difficult to control. In particular, the extent in which the silicon layer 30 is consumed when the silicide is being formed is difficult to predict, and as such, the drain, gate, and source contacts 22, 20, and 24 may extend completely through the silicon layer 30, thereby leaving no silicon for the channel region 12 beneath the gate contact 20. Even when sufficient silicon remains beneath the gate contact 20 for the channel region 12, the relative variability of the thickness $t_c$ of the channel region 12 results in undesired performance variability. Second, even if the depth of the gate contact 20 could be tightly controlled, the MESFET 10 will not perform as desired once the thickness $t_c$ of the channel region 12 becomes too small. For example, when the thickness $t_s$ of the silicon layer 30 is 60 nm or less and the thickness $t_c$ of the channel region 12 is about 30 nm or less, the channel region 12 may not conduct, and thus allow no current to flow, unless there is a relatively large positive voltage applied to the gate contact 20. When a relatively large positive voltage is applied to the gate contact 20, the gate voltage is so high that the MESFET 10 behaves like a diode instead of a transistor, wherein current flows from the gate contact 20 to the source contact 24 before current begins flowing between the drain 26 and the source 28. Accordingly, there is a need for a MESFET architecture that can be formed using CMOS or other processes that employ relatively thin device layers.

SUMMARY OF THE INVENTION

The present invention provides a horizontally depleted Metal Semiconductor Field Effect Transistor (MESFET). The MESFET is formed in a device layer, which resides over a substrate, such as a silicon-on-insulator (SOI) substrate or a sapphire substrate for a silicon-on-sapphire (SOS) architecture. A drain region, a source region, and a channel region are formed in the device layer such that the drain region and the source region are spaced apart from one another and the channel region extends between the drain region and the source region. First and second gate contacts are formed in the device layer on either side of the channel region, and as such, the first and second gate contacts will also reside between opposing portions of the source and drain regions. Source and drain contacts may be provided in the device layer such that the drain contact is adjacent the drain region and the source contact is adjacent the source region. With this configuration, voltages applied to the first and second gate contacts effectively control vertical depletion regions, which form on either side of the channel region. The vertical depletion regions effectively horizontally deplete the channel region, and thus control current flow between the drain region and the source region based on the voltages applied to the first and second gate contacts relative to voltages applied to the source and drain contacts.

In one embodiment, the drain, source, and first and second gate contacts are silicide contacts, which are formed in a silicon device layer. When the channel region is lightly doped, the first and second gate contacts provide Schottky gates on either side of the channel region. When portions of the source and drain regions are heavily doped, the source and drain contacts formed in the heavily doped portions of the source and drain regions are low resistive ohmic contacts for providing electrical connections to the respective drain and source regions. Preferably, the silicide contacts will extend substantially through the device layer, such that only a thin layer of silicon resides beneath the contacts.

MESFETs may be arranged in an array, such that the source and drain regions for the various MESFETs are contiguous and a gate contact for one MESFET may also act as a gate contact for an adjacent MESFET. Further, the gates may be aligned with one another along opposite sides of the channel region, wherein the opposite sides of the channel region extend in the direction of current flow through the channel region. To decrease the gate length of the channel region, the first and second gate contacts may be misaligned with one another, such that they only partially overlap one another along the opposite sides of the channel region. In yet another embodiment, the first and second gate contacts may be completely misaligned with one another such that they do not overlap one another along the opposite sides of the channel region.

To provide further control of the MESFET, a Metal Oxide Semiconductor Field Effect Transistor (MOSFET) gate structure may be provided over the channel region. As such, the channel region may have opposing Schottky gates as well as a traditional MOSFET gate, wherein the voltages applied to the Schottky gates and the traditional MOSFET gate will all influence the current flow in the channel region between the drain and source regions. The MOSFET gate structure may include a dielectric that resides over the channel region and a gate conductor that resides over the gate dielectric.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims. Notably, the terms "inner" and "outer" are used herein to identify relative portions of various sections or regions relative to the center of an overall device or module.

The present invention relates to a Metal Semiconductor Field Effect Transistor (MESFET) architecture that can be formed in seamless processes that employ relatively thin silicon device layers. While traditional MESFETs typically employ a horizontal depletion layer from a channel region, the MESFET architecture of the present invention employs vertical depletion layers in a channel region. In essence, the vertical channel regions are on opposing sides of a conducting channel and effectively provide horizontal depletion of the channel region to control the flow of current between drain and source regions. Given the relatively complex geometry of the present invention, the concepts of the present invention are best understood by initially describing and illustrating a manufacturing process for constructing a MESFET according to one embodiment of the present invention. The manufacturing process is illustrated in FIGS. 2-6.

Figure 1A:
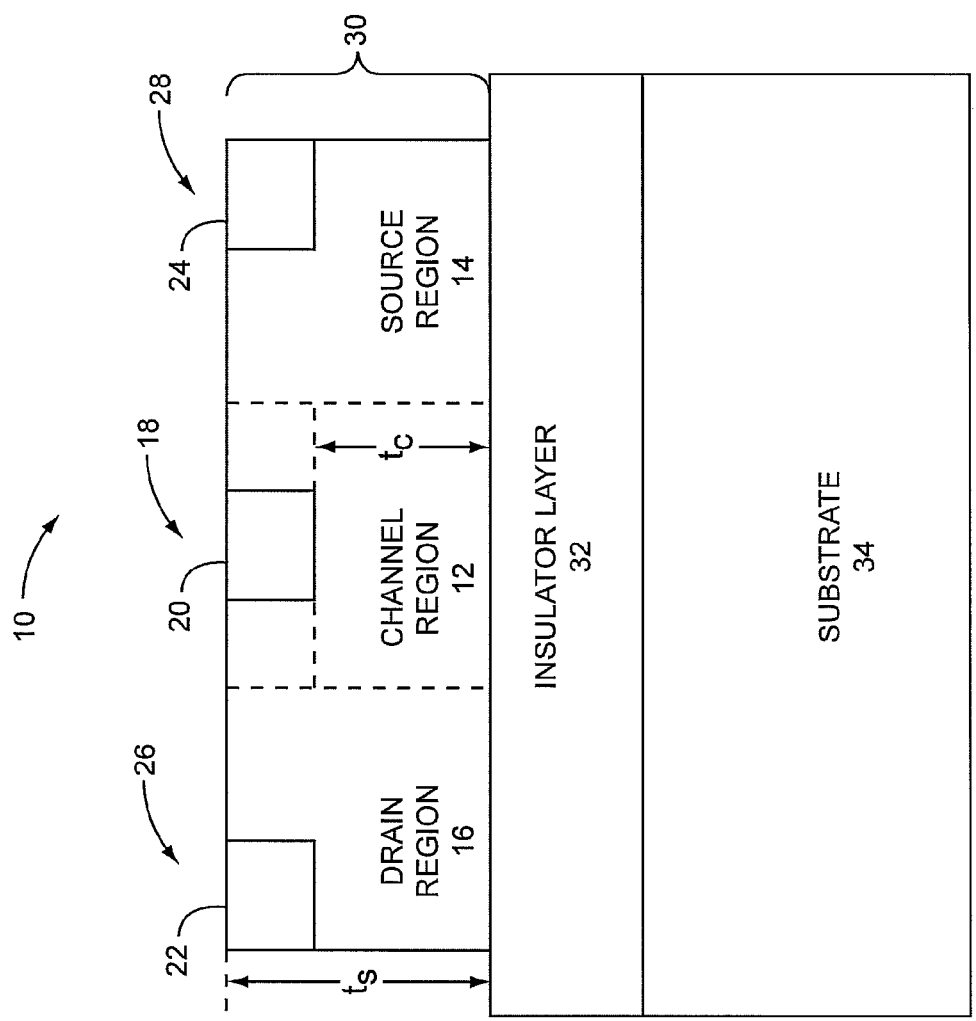
FIGS. 1A and 1B illustrate traditional Metal Semiconductor Field Effect Transistor (MESFET) architectures, which are formed in silicon device layers of varying thicknesses.
Figure 1B:
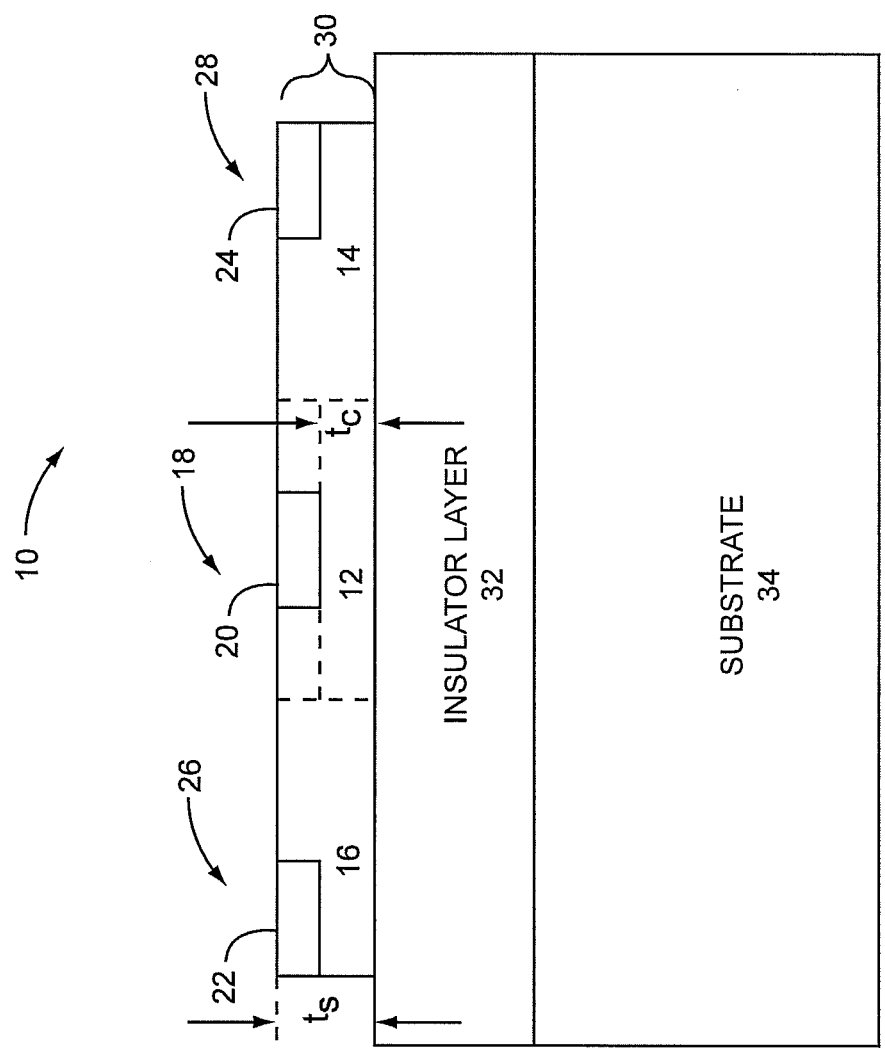
Figure 2:
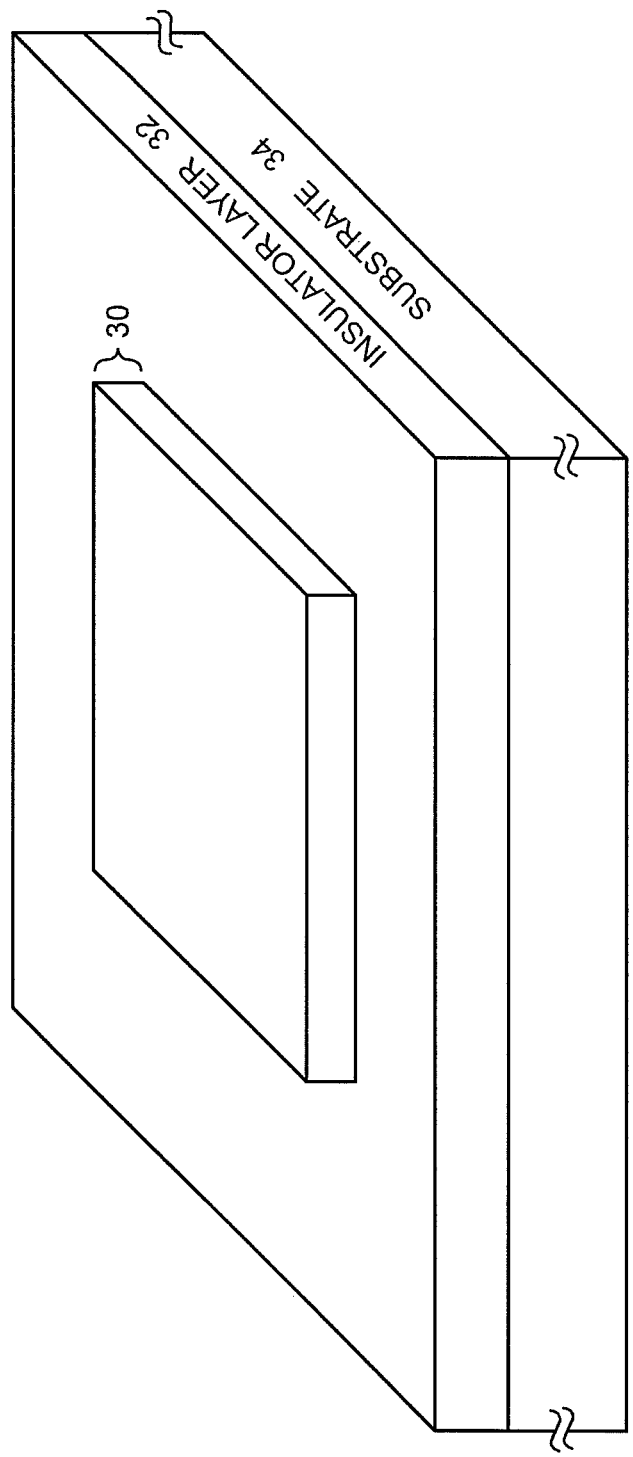
FIGS. 2-6 illustrate a fabrication process for making a MESFET according to one embodiment of the present invention.

With particular reference to FIG. 2, a silicon-on-insulator (SOI) wafer is provided wherein a silicon layer 30 resides over an insulator layer 32, and the insulator layer 32 resides over a substrate 34. Those skilled in the art will recognize various structures on which the silicon layer 30 may be provided. The insulator layer 32 may be a buried oxide or other material, such as sapphire. In embodiments employing a silicon-on-sapphire (SOS) process, the insulator layer 32 and the substrate 34 are effectively a single substrate that is formed from sapphire. As such, the silicon layer 30 resides directly over the substrate 34. The insulator layer 32 may be separate from the substrate 34 or may be part of the substrate 34. Regardless of the configuration of the insulator layer 32 and the substrate 34, the silicon layer 30 is the device layer in which the MESFET architectures of the present invention are formed.

Figure 3:
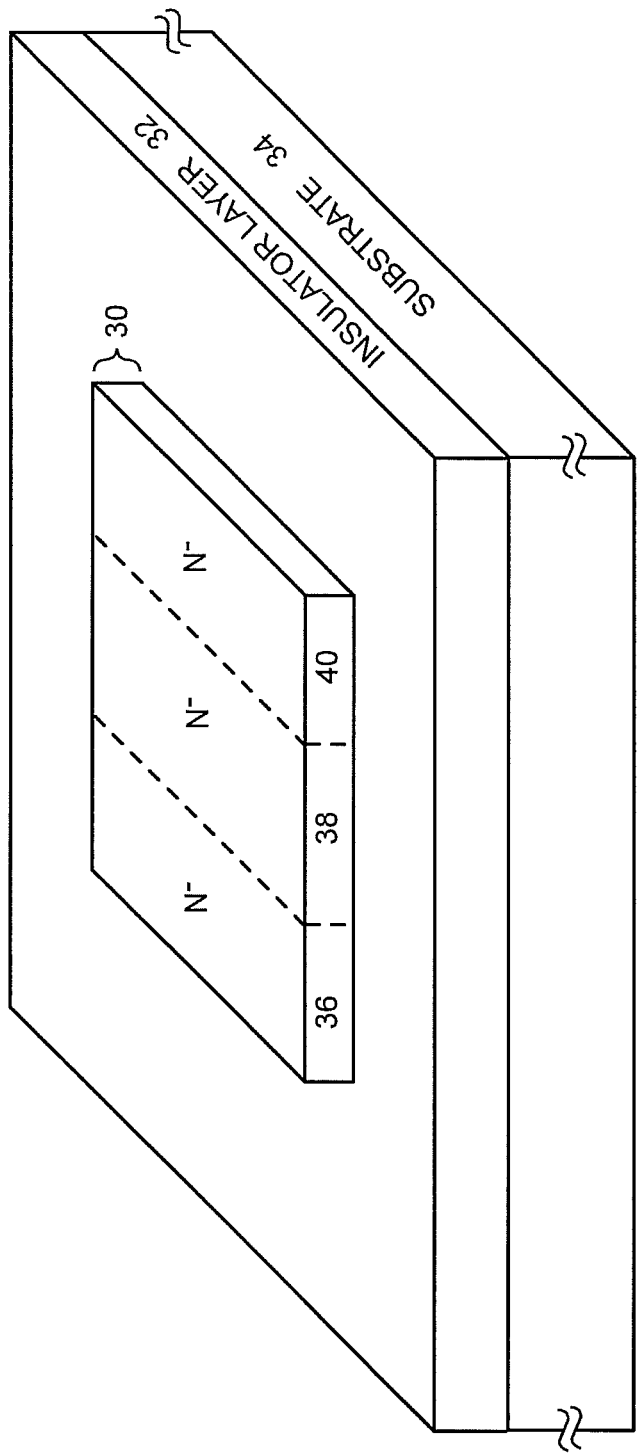

Assuming processing is for an N-channel device, the silicon layer 30 is uniformly and lightly doped with an N-type material (N⁻), as illustrated in FIG. 3. For P-channel devices, the silicon layer 30 would be lightly doped with a P-type material. For ease of reference in the following description, the silicon layer 30 is divided into three sections: a drain section 36, a gate section 38, and a source section 40. These sections are not necessarily formed or delineated during actual processing and are merely used as an aid in referencing different portions of the silicon layer 30. In this example, assume that the drain section 36, gate section 38, and source section 40 are initially doped with N-type material at a concentration level of $1\times10^{18}$ cm$^{-1}$ or less, and preferably at a concentration level between $2\times10^{17}$ cm$^{-1}$ and $8\times10^{17}$ cm$^{-1}$.

Figure 4A:
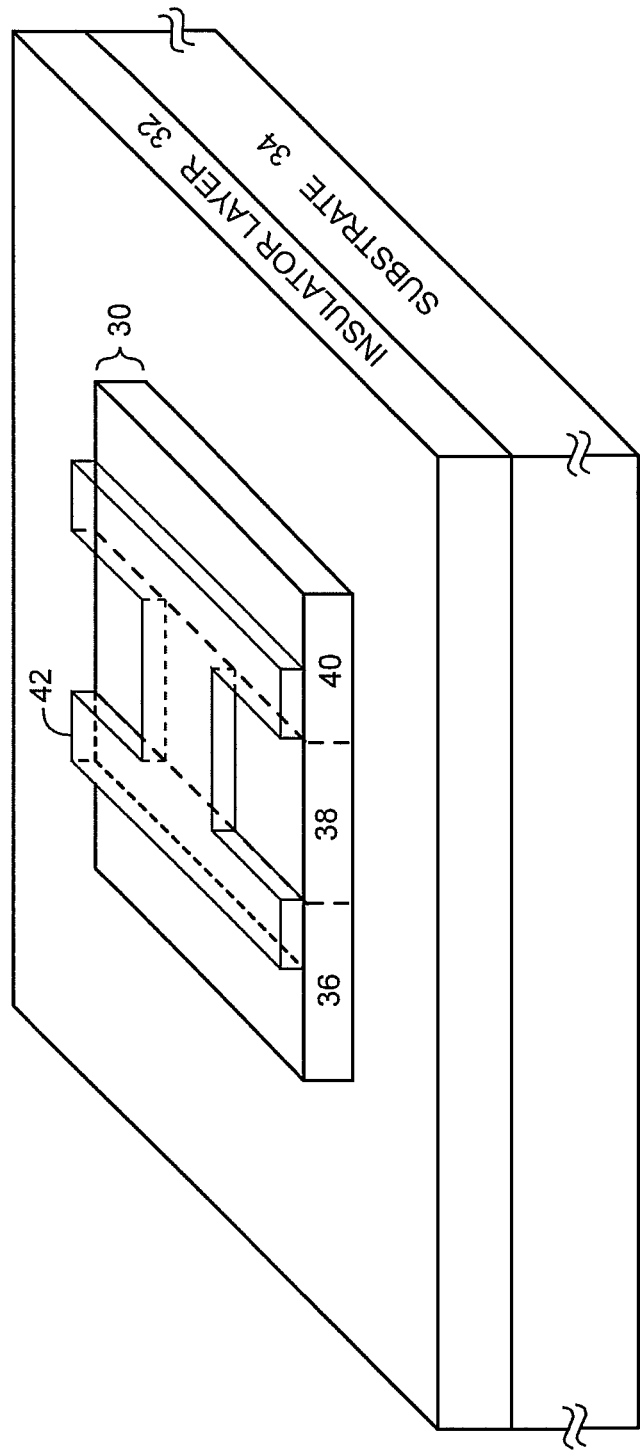
Figure 4B:
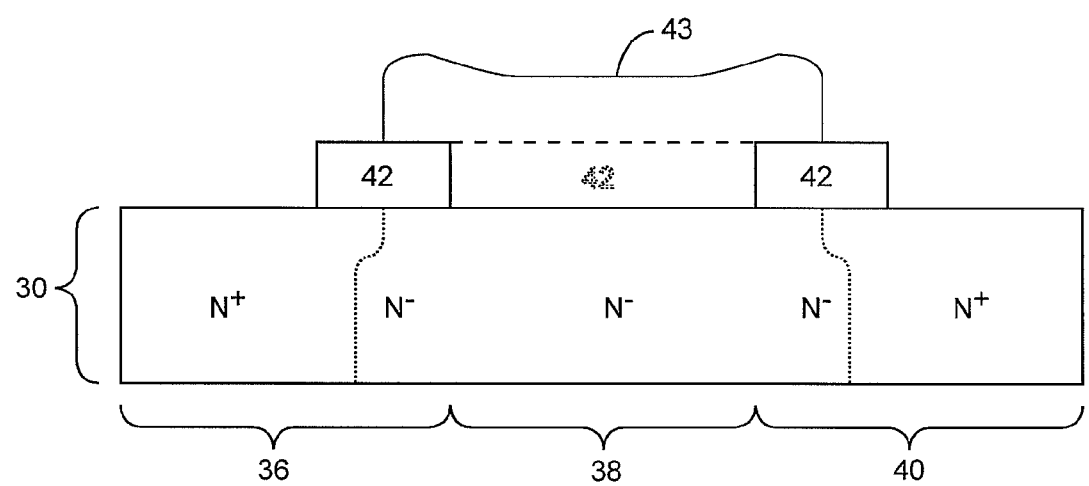

Turning to FIG. 4A, a mask 42 in the form of an "H" is formed out of silicon dioxide, silicon nitride, or like material that will prevent any areas residing beneath the mask 42 from reacting with a metal in a subsequent silicide process. As illustrated, the vertical sides of the H respectively cover inside portions of the drain section 36 and the source section 40, which are adjacent to the gate section 38. The H's cross member, which connects the vertical sides of the H, extends across a middle portion of the gate section 38. After the mask 42 is formed, a photoresist material 43 is formed over the gate section and the inside portions of the drain section 36 and the source section 40, as illustrated in FIG. 4B. In particular, the photoresist material 43 will extend onto and over the inside portions of the vertical sides of the H and cover all of the H's cross member. Ion implantation follows, wherein those portions of the drain section 36 and the source section 40 that are not protected by the photoresist material 43 are heavily implanted (N+) with N-type material for N-channel devices or P-type material for P-channel devices. Again, the illustrated example is for an N-channel device, and as such, the outside portions of the drain section 36 and source section 40 are heavily doped with N-type material, while the gate section 38 and the inside portions of the drain section 36 and the source section 40 that are adjacent the gate section 38 remain lightly doped with N-type material. The dotted lines in FIG. 4B represent dividing lines between lightly (N−) and heavily (N+) doped portions of the silicon layer 30. In this example, assume that the heavily doped portions of the drain section 36 and the source section 40 are doped with N-type material at a concentration level of $1\times10^{19}$ cm$^{-1}$ or greater. After doping, the photoresist material 43 is removed for further processing.

Figure 5A:
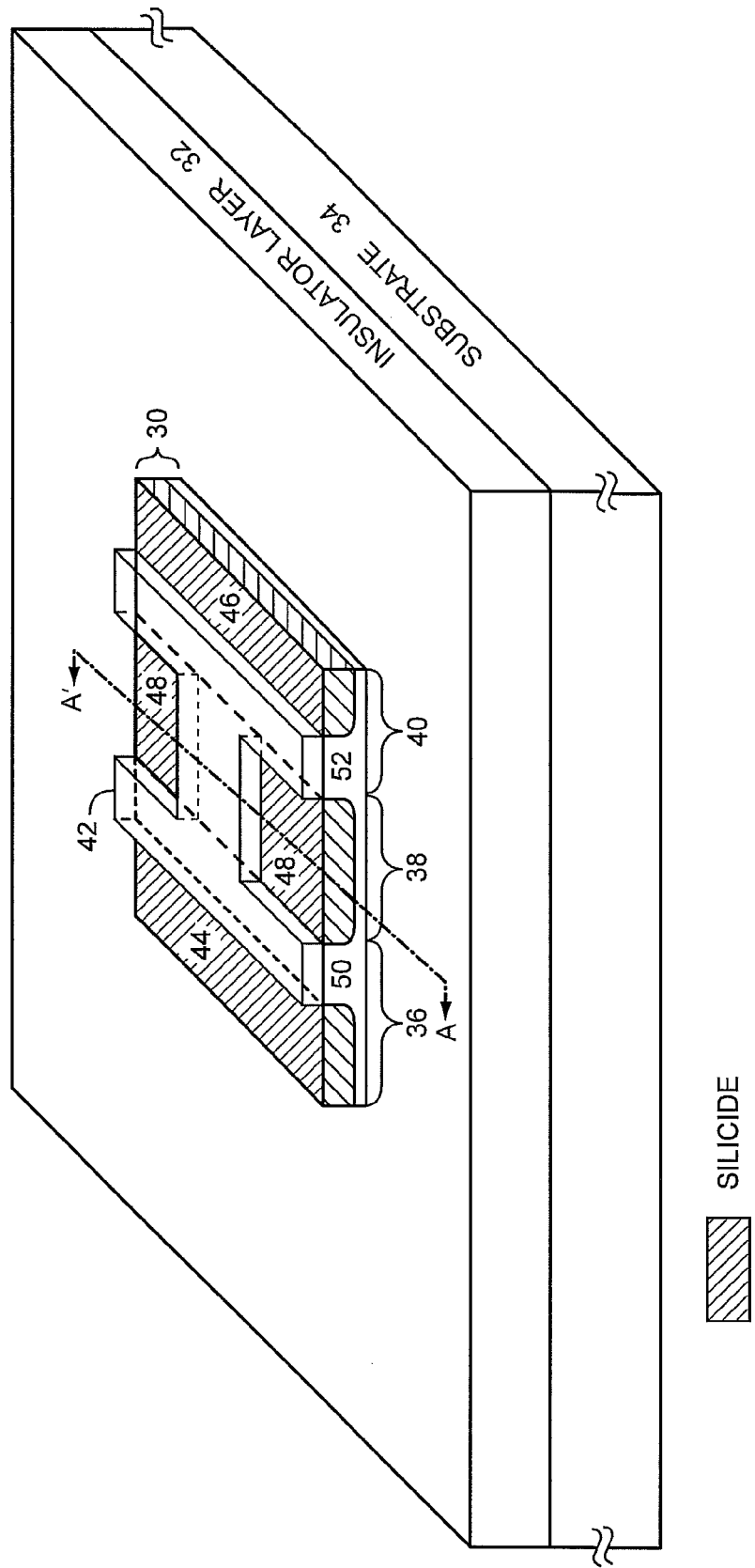
Figure 5B:
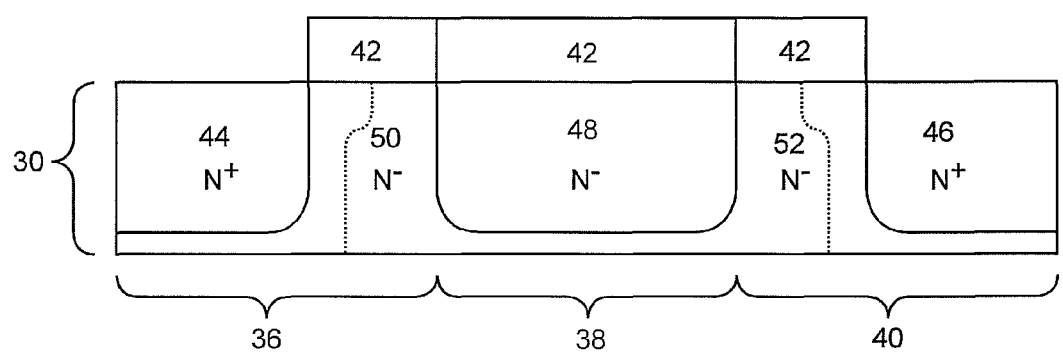

Next, a thin layer of metal (not shown), such as cobalt, nickel, platinum, or the like, is formed over the exposed surfaces of the silicon layer 30 and the mask 42. After the metal layer, which is not illustrated, is formed, the structure is heated to 400 to 800 C, depending on the metal being used, such that those portions of the metal layer that are in contact with the silicon layer 30 react with one another in a silicide forming process. During the reaction, a portion of the silicon layer 30 is consumed and a silicide, such as cobalt disilicide or nickel monosilicide, is formed in the silicon layer 30, as illustrated in FIGS. 5A and 5B. A silicide is not formed in those portions of the silicon layer 30 that reside beneath the mask 42. The metal remaining over the mask 42 and any remaining metal on the silicon layer 30 is removed through an appropriate etching process to provide the structure. As a result of the silicide forming process, the heavily doped outside portions of the drain section 36 and the source section 40 will include a silicide drain contact 44 and a silicide source contact 46, respectively. Notably, the relative doping concentrations throughout the silicon layer 30 are illustrated in FIG. 5B and are not illustrated in FIG. 5A. Further, two silicide gate contacts 48 are formed in the lightly doped gate section 38, wherein one silicide gate contact 48 is formed above the H's cross member and between the vertical sides of the H and a second silicide gate contact 48 is formed below the H's cross member and between the vertical sides of the H. Notably, the lightly doped inside portions of the drain section 36 and the source section 40 separate the first and second gate contacts 48 from the drain contact 44 and the source contact 46.

The portion of the drain section 36 that does not provide the silicide drain contact 44 generally remains silicon and represents a drain region 50. The portion of the source section 40 that does not include the silicide source contact 46 generally remains silicon and represents a source region 52. Both the drain region 50 and the source region 52 may include outer portions that are heavily doped and inner portions that are lightly doped. The dotted lines in FIG. 5B represent dividing lines between lightly (N⁻) and heavily (N⁺) doped portions of the silicon layer 30. Notably, a thin layer of silicon may remain beneath the silicide drain, source, and gate contacts 44, 46, and 48. In such an embodiment, the silicon beneath the drain contact 44 and the source contact 46 remains heavily doped, while the silicon beneath the gate contacts 48 remains lightly doped. In other embodiments, the silicide drain, source, and gate contacts 44, 46, and 48 may extend completely through the silicon layer 30.

The type of contact formed during a silicide forming process is generally a function of the doping concentration of the silicon in which a silicide is to be formed. If a silicide is formed in a heavily doped region, a very low resistance contact is formed in the silicon. Accordingly, the silicide drain contact 44 and the silicide source contact 46 are formed in heavily doped silicon and will represent the resistive contacts for the drain region 50 and the source region 52, respectively. If the silicide contact is formed in a relatively lightly doped region of silicon, a Schottky contact is formed. As such, since the gate section 38 is relatively lightly doped, the silicide gate contacts 48, which are formed in the lightly doped gate section 38, will represent Schottky gate contacts.

Figure 6:
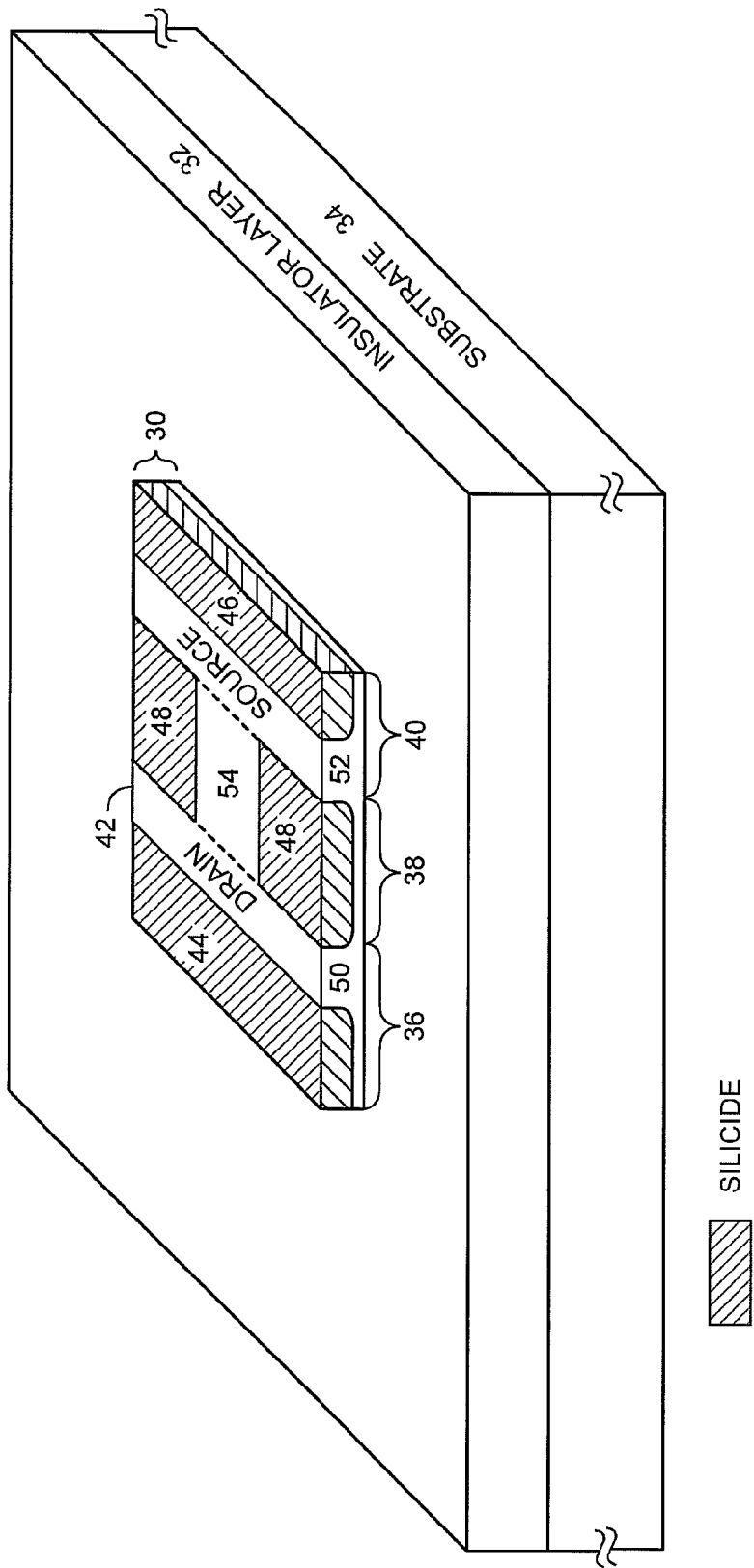
Figure 7:
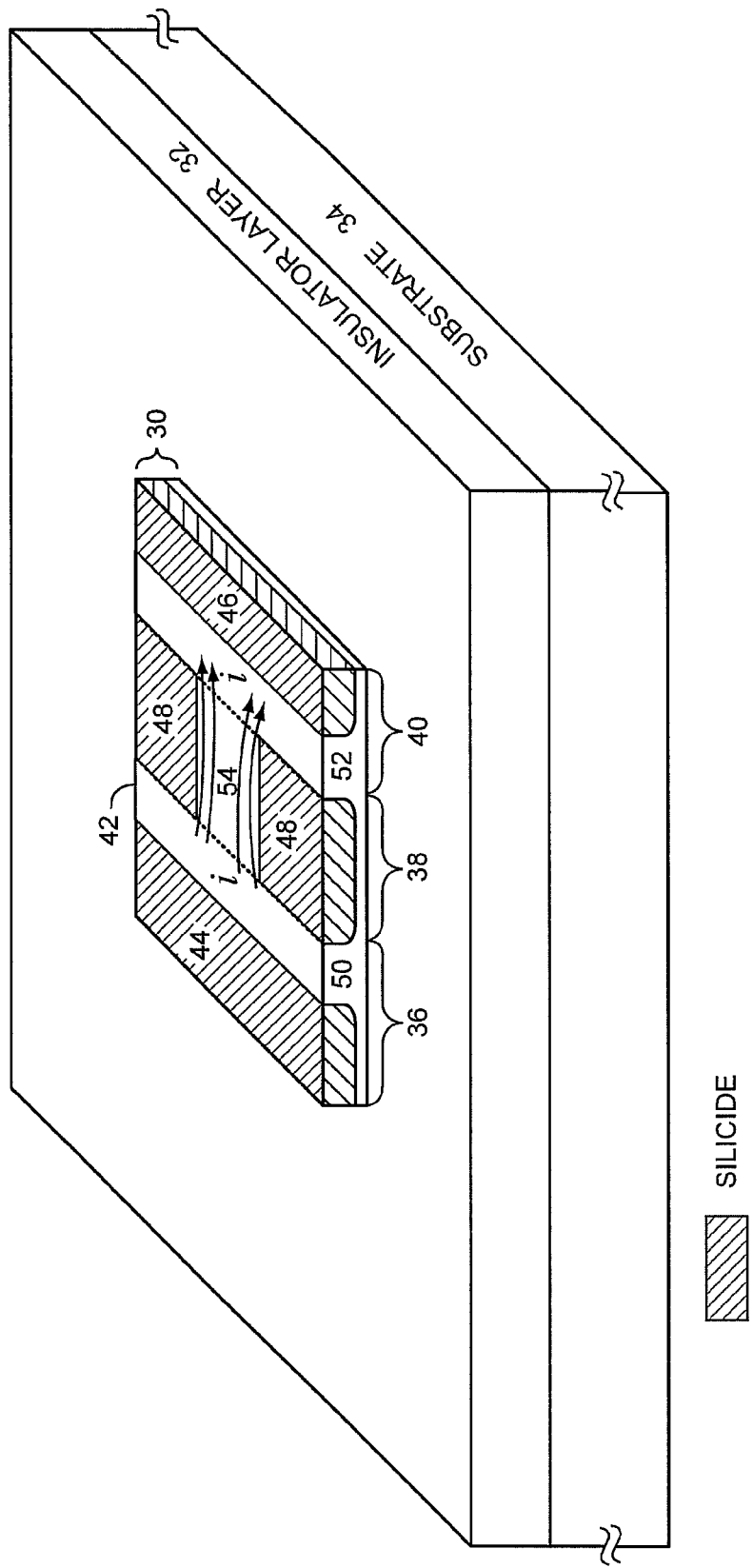
FIG. 7 illustrates exemplary current flow through a channel region according to one embodiment of the present invention.

With reference to FIG. 6, the resulting structure is illustrated without the mask 42. Without the mask 42, a lightly doped channel region 54 is revealed. The channel region 54 resides in the remaining silicon between the gate contacts 48 and connecting the drain region 50 and the source region 52. As illustrated in FIG. 7, current i may flow from the drain region 50 to the source region 52 through the channel region 54, depending on the voltage applied to the gate contacts 48. Notably, the MESFET architecture of the present invention supports both enhancement mode and depletion mode operation, depending on device parameters, which will be appreciated by those skilled in the art upon understanding the concepts of the present invention.

Figure 8:
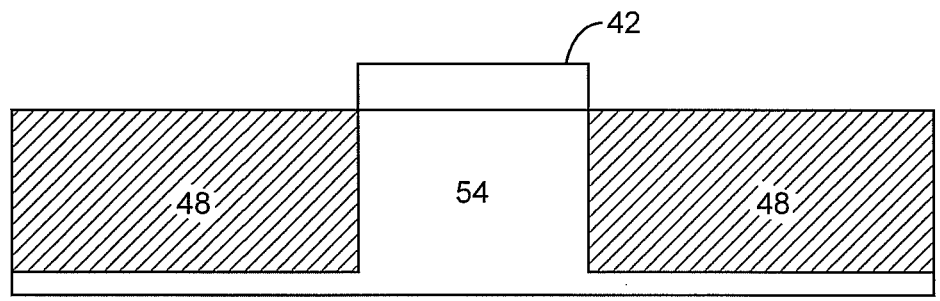
FIG. 8 illustrates a cross section along A-A' of the MESFET architecture illustrated in FIG. 5A.

FIG. 8 provides a cross section of the MESFET architecture that is illustrated in FIG. 5 along lines A-A'. The cross section extends through the channel region 54 and the gate contacts 48, which reside on either side of the channel region 54. As illustrated, a thin layer of silicon may remain beneath the silicide gate contacts 48. The mask 42, which resides over the channel region 54 and along the H's cross member, is also depicted. Accordingly, current will flow into or out of FIG. 8 within the channel region 54 between the drain region 50 and the source region 52 based on the voltage applied to the gate contacts 48.

Figure 9:
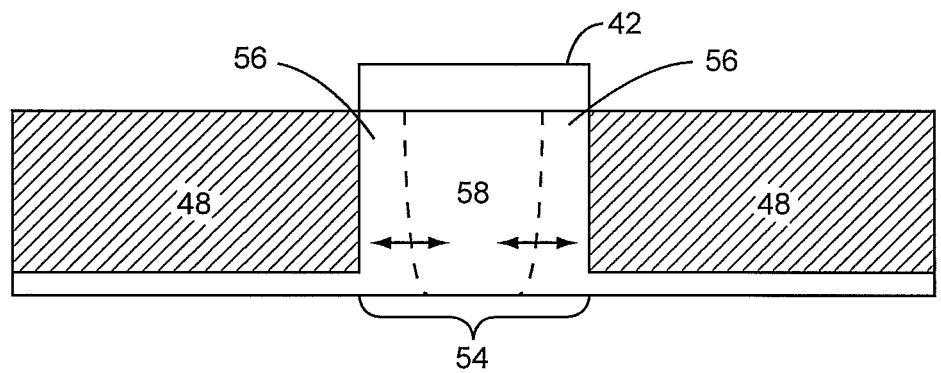
FIG. 9 illustrates vertical depletion regions that are controllable within the channel region according to one embodiment of the present invention.

Turning now to FIG. 9, an increase or decrease in the voltage applied to the gate contacts 48 with respect to the voltage applied to the source contact 46 will cause vertically oriented depletion regions 56 to expand or contract, thereby effectively changing the cross sectional area of a conducting channel 58 that is formed within the channel region 54 and between the vertical depletion region 56. The conducting channel 58 represents the portion of the channel region 54 through which current flows. The amount of current flowing in the conducting channel 58 is proportional to the size of the conducting channel 58. In essence, each vertical depletion region 56 forms along the vertical side of a corresponding gate contact 48, wherein the width of each vertical depletion region 56 increases or decreases to control the size of the conducting channel 58. As the width of the vertical depletion regions 56 increases, the size, and in particular the width, of the conducting channel 58 decreases, and vice versa. Since the vertical depletion regions 56 are effectively formed on either side of the conducting channel 58 and the width of the vertical depletion regions 56 changes in a horizontal direction, the channel region 54 is considered to be horizontally depleted.

In a preferred embodiment, the N-channel MESFET operates as a depletion mode device. During operation, applying a negative voltage to the gate contacts 48, relative to the source contacts 46, effectively increases the width of the depletion regions 56. In essence, application of the negative voltage to the gate contacts 48 functions to deplete electrons that are flowing through the channel region 54. As the voltage applied to the gate contacts 48 becomes more negative, the width of the depletion regions 56 increases, and as a result, the number of electrons flowing through the channel region 54 decreases. When the voltage applied to the gate contacts 48 is sufficiently negative, the depletion regions 56 will effectively close off the conducting channel 58 within the channel region 54 to prevent the flow of current through the channel region 54. As a result, the MESFET is effectively turned off.

For enhancement mode N-channel devices, a positive voltage with respect to the source contacts 46 is applied to the gate contacts 48 to decrease the width of the depletion regions 56 and effectively increase the ability of the channel region 54 to allow current to flow from the drain region 50 through the source region 52. For enhancement mode devices, care should be taken in the design to prevent current flowing into the Schottky gate and to the source region 52 prior to the MESFET being able to deliver current from the drain region 50 to the source region 52. P-channel devices may be formed in an analogous fashion.

Figure 10:
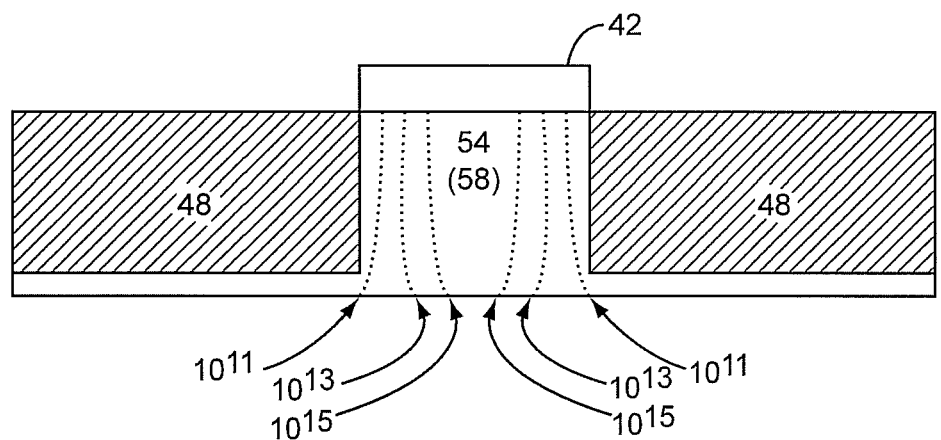
FIG. 10 illustrates relative current densities in the channel region according to one embodiment of the present invention.

With reference to FIG. 10, the current density throughout the channel region 54 is illustrated at a given depletion level. In particular, the dotted lines are contours defining certain electron concentration levels. The effective conducting channel 58 has an electron concentration of greater than $1 \times 10^{15}$ cm$^{-3}$ in the middle of the channel region 54. The electron concentrations exponentially decrease as the sides of the gate contacts 48 are approached. For example, the electron concentration along the sides and beneath the gate contacts 48 may be less than $1 \times 10^{11}$ cm$^{-3}$, while the center of the channel region 54, which is the effective conducting channel 58, has an electron concentration that exceeds $1 \times 10^{15}$ cm$^{-3}$.

Figure 11:
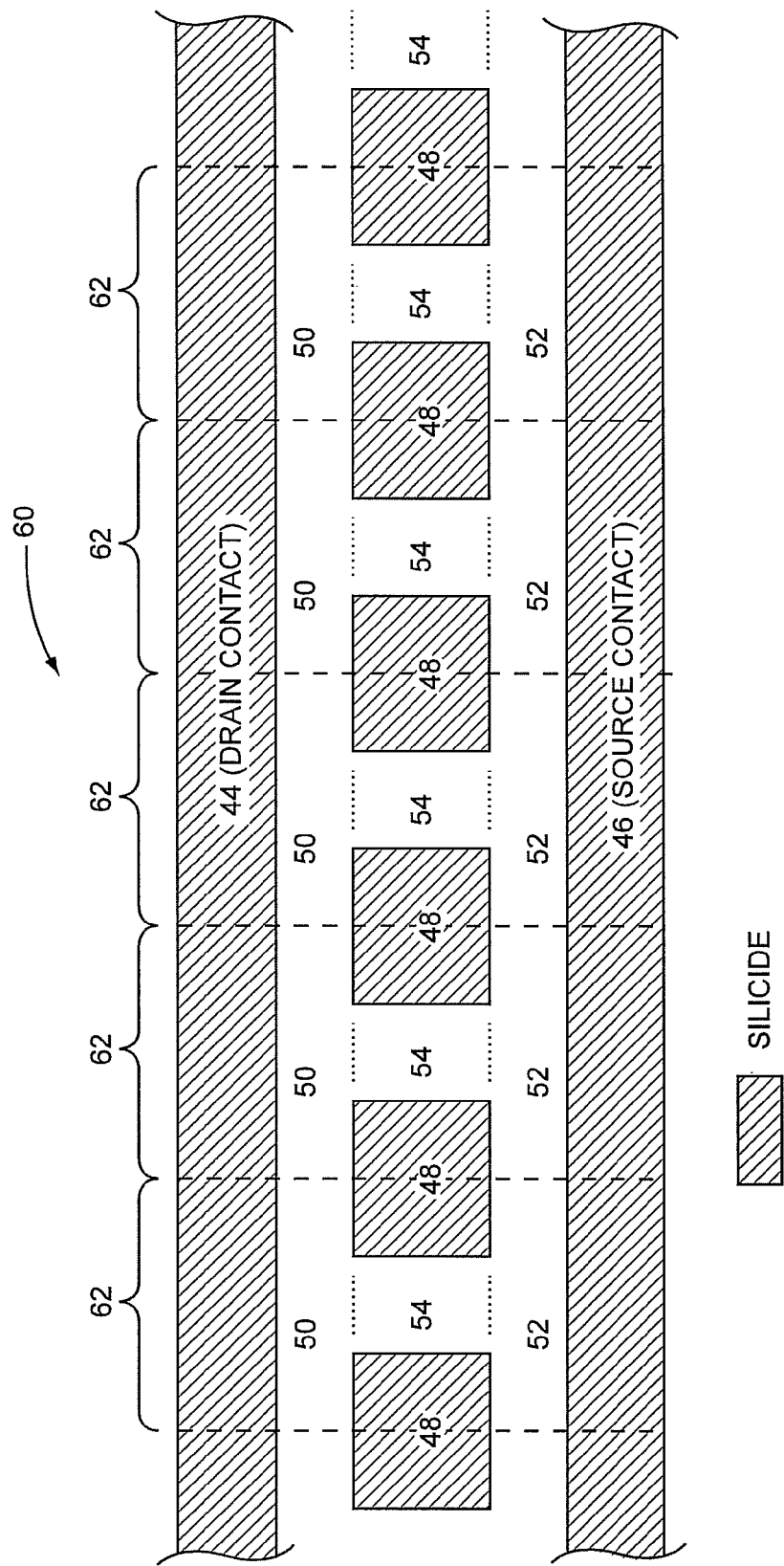
FIG. 11 illustrates an exemplary array of MESFET devices constructed according to one embodiment of the present invention.

Depending on the current requirements for a particular application, the MESFETs of the present invention may be formed in extensive arrays, such as that illustrated in FIG. 11. As depicted, a MESFET array 60 is formed from a number of MESFET modules 62, wherein each MESFET module 62 is substantially configured as that described above in association with FIGS. 2-10. In essence, the H-shaped cores of the MESFET modules 62 are strung together in a series array. Since each channel region 54 for each MESFET module 62 represents a finger, the MESFET array 60 may be considered a multi-fingered array. Such arrays may have any number of fingers, wherein the number of MESFET modules 62 may extend into the hundreds of modules. Adjacent MESFET modules 62 may share gate contacts 48 while any number, if not all, of the MESFET modules 62 may have a continuous drain contact 44 and source contact 46. The drain regions 50 and the source regions 52 of adjacent MESFET modules 62 may be contiguous with one another and formed from continuous silicon sections as illustrated. The arrays need not be linear in their geometry, and thus, may be laid out in any fashion without deviation from the concepts of the present invention.

Figure 12:
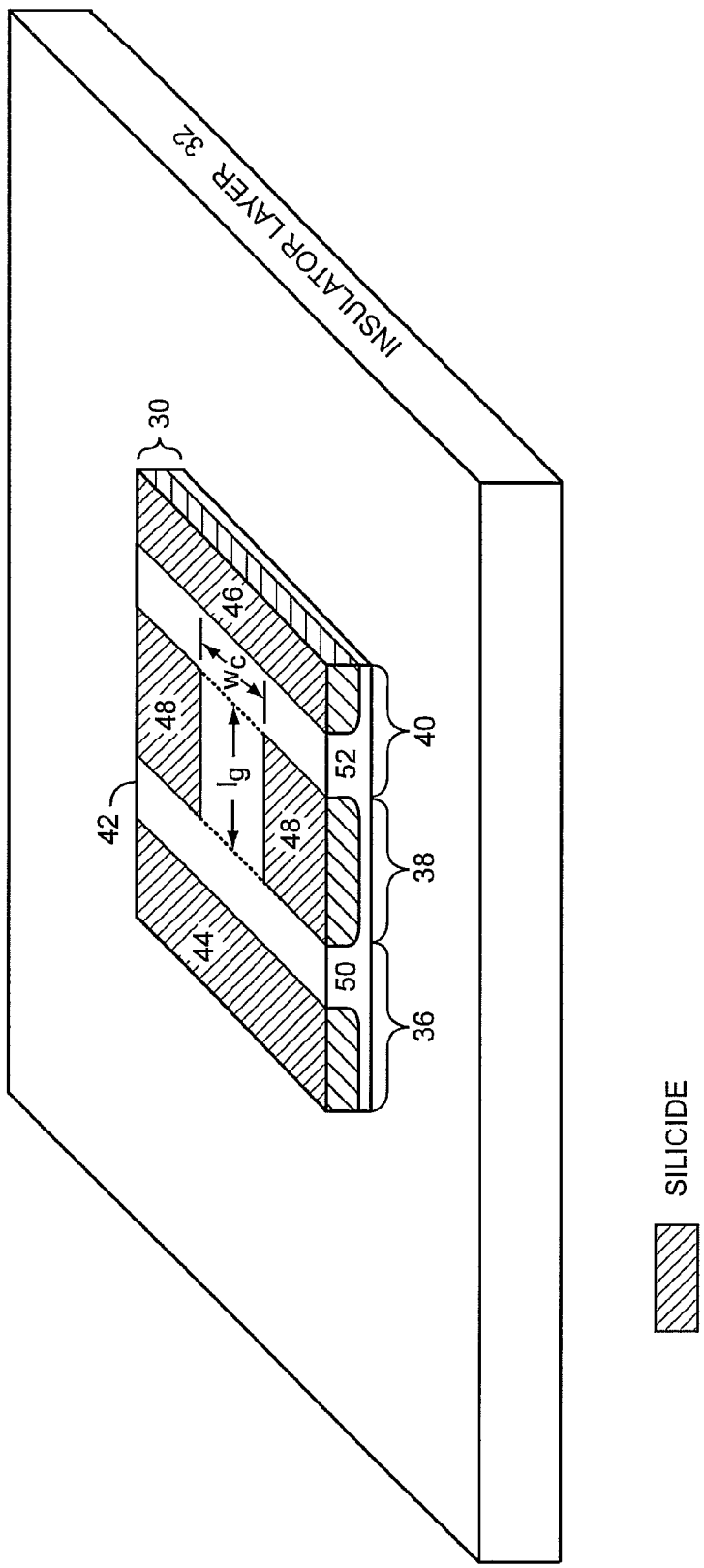
FIG. 12 illustrates the gate length $l_g$ and channel width $w_c$ according to one embodiment of the present invention.

Prior to describing other embodiments of the present invention, various parameters are defined in association with FIG. 12. In particular, a channel width $w_c$ is generally the width of the channel region 54, which is the effective separation of the gate contacts 48 along a line that is normal to the direction of current flow through the channel region 54. A gate length $l_g$ is generally a function of the extent to which the gate contacts 48 overlap one another along the direction of current flow in the channel region 54. Both the channel width $w_c$ and the gate length $l_g$ are depicted in FIG. 12, which represents merely one embodiment of the present invention. Notably, the effective channel width $ew_c$ of a MESFET array 60, such as that illustrated in FIG. 11, is generally the average channel width $w_c$ of the MESFET module 62 times the number of MESFET modules 62 in the MESFET array 60, wherein:

$ew_c = w_c \times n$, wherein n equals the number of interconnected MESFET modules 62 in a MESFET array 60.

A channel height $h_c$ (not illustrated) is generally the thickness of the silicon layer 30. Although those skilled in the art will recognize various dimensions for a given MESFET module 62, certain embodiments of the present invention will employ gate lengths $l_g$ between about 10 microns and 10 nanometers and channel widths $w_c$ between 0.1 and 1 microns (micrometers). In a preferred embodiment, the channel width $w_c$ is inversely related to the extent of doping of the channel region 54. In essence, the greater the doping concentration in the channel region 54, the smaller the channel width $w_c$ that is necessary to obtain similar performance.

In many instances, design rules associated with Complementary Metal Oxide Semiconductor (CMOS) processing and the manufacture of semiconductor devices presents limitations relating to size, shape, and dimensions of various aspects of particular semiconductor devices. Whether to address limitations of available CMOS processes or to fine tune parameters associated with a particular design, the gate contacts 48 may be offset from one another by varying degrees. In general, the extent of the offset impacts operating frequency and drive current. In particular, reductions in gate lengths $l_g$ generally correspond to higher operating frequencies and increased drive currents.

Figure 13:
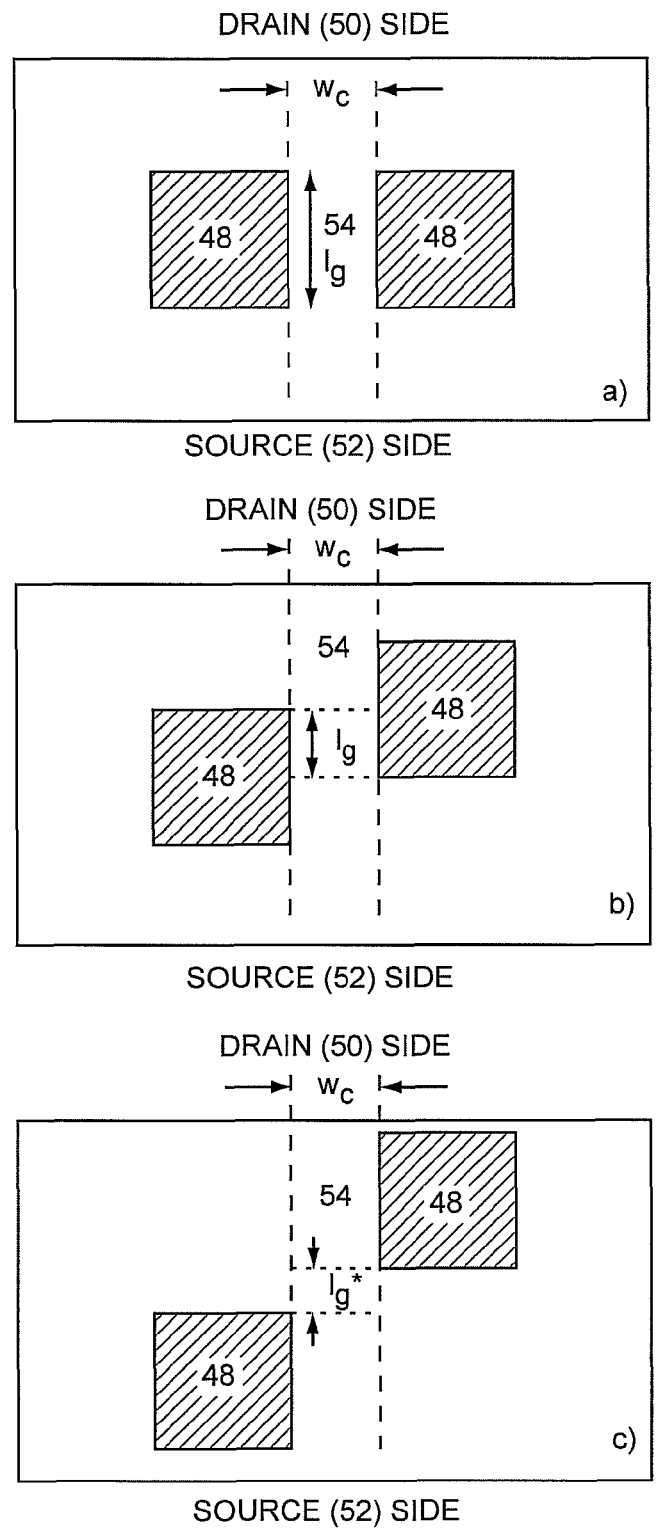
FIG. 13 illustrates three different orientations for gate contacts according to one embodiment of the present invention.

With reference to FIG. 13, three different overlapping configurations are provided for the gate contacts 48. In FIG. 13 *a*), the gate contacts 48 are aligned along the direction of current flow in the channel region 54. In FIG. 13 *b*), the gate contacts 48 partially overlap one another and thereby reduce the gate length $l_g$ in comparison to the aligned gate contacts 48 of FIG. 13 a). Again, the reduction in the gate length $l_g$ is often desired for a variety of reasons, including increasing the operating frequency and drive current associated with the MESFET device. Interestingly, in FIG. 13 c), the gate contacts 48 are misaligned such that they do not overlap one another along the direction of current flow in the channel region 54. Due to the electrical characteristics of the vertical depletion regions 56 (not shown in FIG. 13 c)), this configuration has shown to provide maximum drive current and frequency performance; however, as those skilled in the art will appreciate, the effective gate length $l_g*$ may impact other operating parameters, such as threshold voltages and the like.

Figure 14:
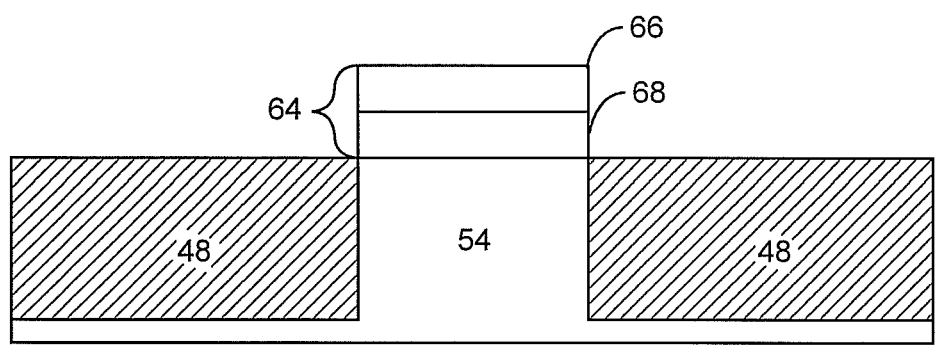
FIG. 14 illustrates a Metal Oxide Semiconductor Field Effect Transistor (MOSFET) gate architecture residing over the channel region according to one embodiment of the present invention.

In yet another embodiment of the present invention, a Metal Oxide Semiconductor Field Effect Transistor (MOSFET) gate structure may be provided over the channel region 54 to provide yet another mechanism for controlling current flow in the channel region 54. With reference to FIG. 14, a MOSFET gate structure 64 is provided over the channel region 54. In traditional MOSFET fashion, the MOSFET gate structure 64 will include a gate conductor 66, which is separated from the channel region 54 by a gate dielectric 68. Accordingly, the gate contacts 48 provide the Schottky gate contacts that are traditionally found in MESFET structures while the MOSFET gate structure 64 provides the traditional gate structure found in a MOSFET device. If a positive voltage is applied to the gate conductor 66, electrons are attracted into the silicon channel region 54, which will tend to increase the current flowing in the channel region 54. If a negative voltage is applied to the gate conductor 66, electrons are repelled from the silicon channel region 54, which tends to decrease the amount of current flowing in the channel region 54.

Figure 15:
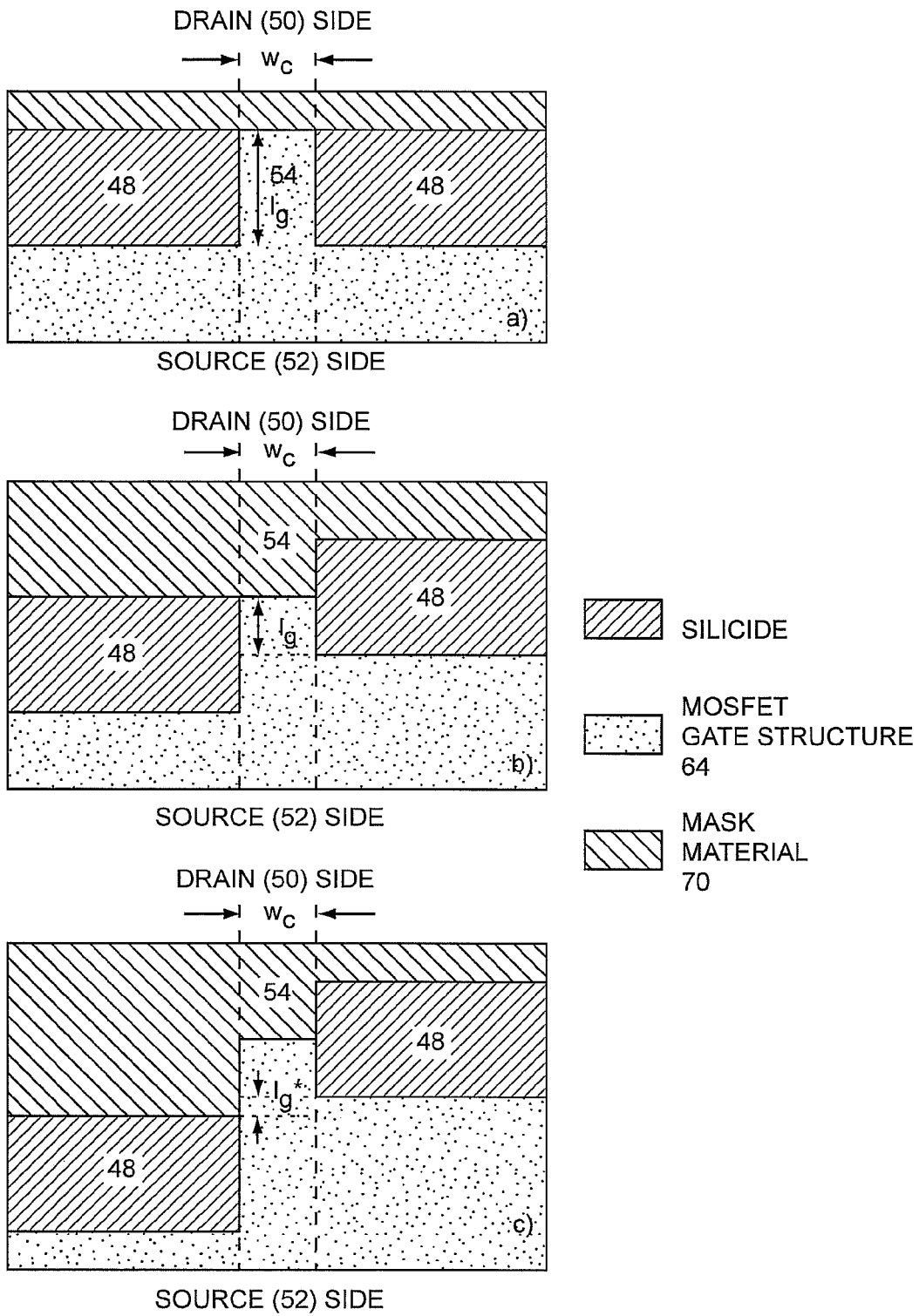
FIGS. 15 and 16 illustrate various configurations for creating the MOSFET gate architecture as well as masking certain portions of the device layer to facilitate the formation of drain, gate, and source contacts according to one embodiment of the present invention.

Notably, the MOSFET gate structure 64 may incorporate the mask 42, which is used to assist in creating the silicide drain, source, and gate contacts 44, 46, and 48. For example, the mask 42 may be formed from the same layers that are used to create traditional MOSFET gate stacks. A traditional MOSFET gate stack will include a metal, such as poly-silicon, and an oxide, wherein the poly-silicon corresponds to the gate conductor 66 and the gate oxide corresponds to the gate dielectric 68. This poly-silicon/oxide gate stack may act as a mask 42 for the silicide process as well as be used to form the MOSFET gate structure 64. Thus, if the mask 42 is made out of the poly-silicon and oxide gate stack of a traditional CMOS process, the gate conductor 66 and the gate dielectric 68 may be provided by these respective layers to form the MOSFET gate structure 64. The MOSFET gate structure 64 may take various forms based on the desired operational and performance characteristics for the MESFET device. As illustrated in FIG. 15, the MOSFET gate structure 64 and a separate mask material 70 may be used to form the overall mask 42, which is employed during the process in which the silicide gate contacts 48 are formed. Accordingly, a portion of the mask 42 may be constructed to provide the MOSFET gate structure 64 for the MESFET device. As illustrated in FIGS. 15 a), b), and c), different MOSFET gate structures 64 are illustrated along with varying alignments of associated gate contacts 48, wherein a first part of the mask 42 is formed from a MOSFET gate structure 64 and a second part of the mask 42 is formed from the mask material 70. FIGS. 15 a), b), and 15 c) illustrate that the gate contacts 48 may be aligned, partially overlapped, or completely offset in addition to employing a MOSFET gate structure 64, as illustrated. The MOSFET gate structure 64 may extend over the channel region 54 as well as portion of the source region 52. The capacitance associated with the source region 52 and the drain region 50 may be controlled by employing a portion of the MOSFET gate structure 64 over the source region 52 (as depicted) or the drain region 50 (not depicted). Notably, the MOSFET gate structure 64 is shown as being biased towards the source region 52; however, the opposite configurations are also available, wherein the MOSFET gate structure 64 is biased towards the drain region 50.

Figure 16:
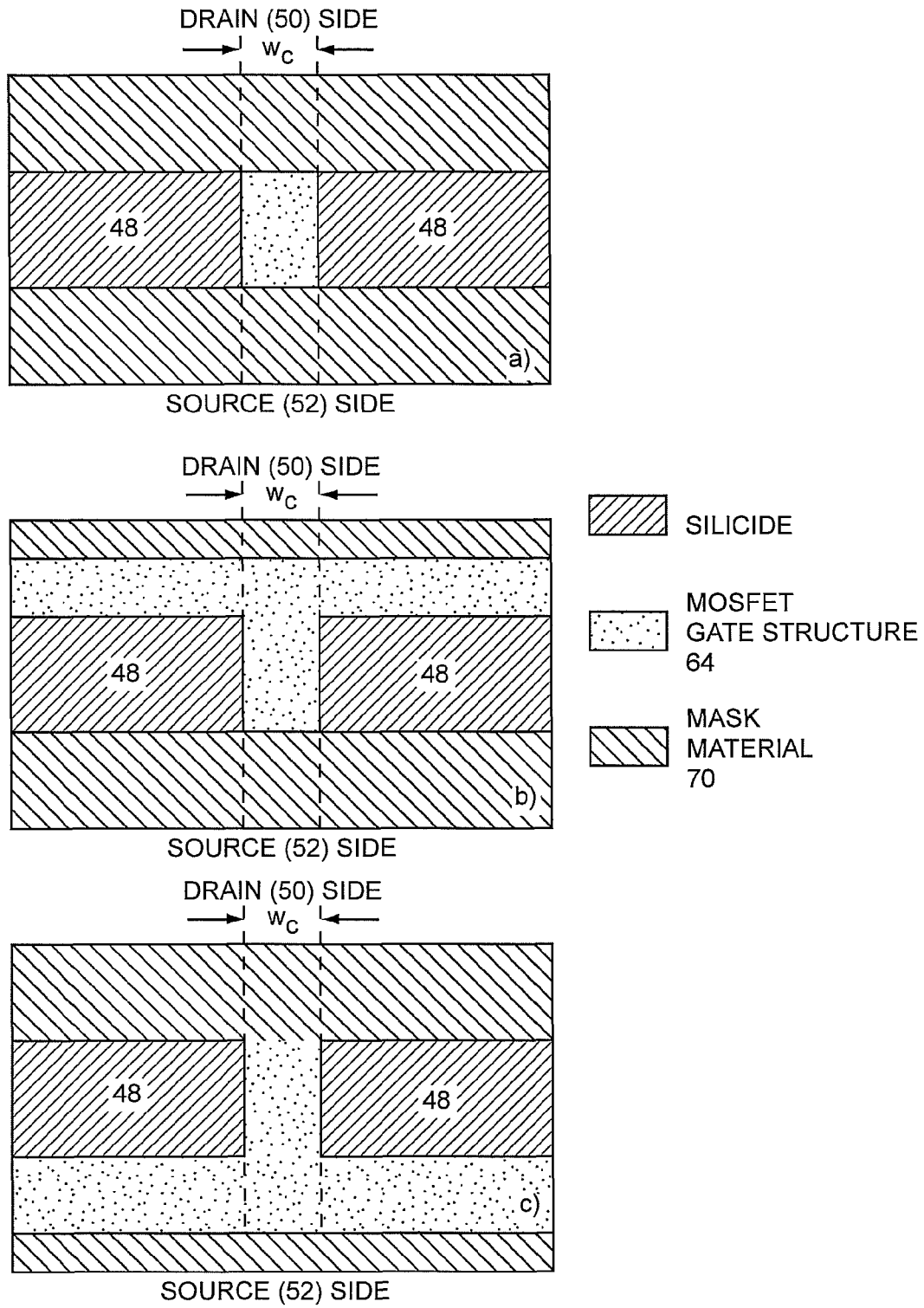

FIG. 16 illustrates further embodiments wherein the MOSFET gate structure 64 is used to create different types of MOSFET gate structures 64. In these embodiments, the gate contacts 48 are aligned with one another; however, these concepts may be employed with partially overlapping or completely offset gate contacts 48. In FIG. 16 a), the MOSFET gate structure 64 resides only over the channel region 54 between the gate contacts 48. However, in FIGS. 16 b) and c), the MOSFET gate structure 64 extends laterally, such that adjacent MOSFET modules 62 in a MESFET array 60 may have a common electrical connection among their MOSFET gate structures 64. Accordingly, in a MESFET array 60, which includes a plurality of MESFET modules 62, each MESFET module 62 will include a portion of the MOSFET gate structure 64 that resides over the channel region 54 and another contiguous portion that extends to the MOSFET gate structure 64 of adjacent MESFET modules 62.

Figure 17:
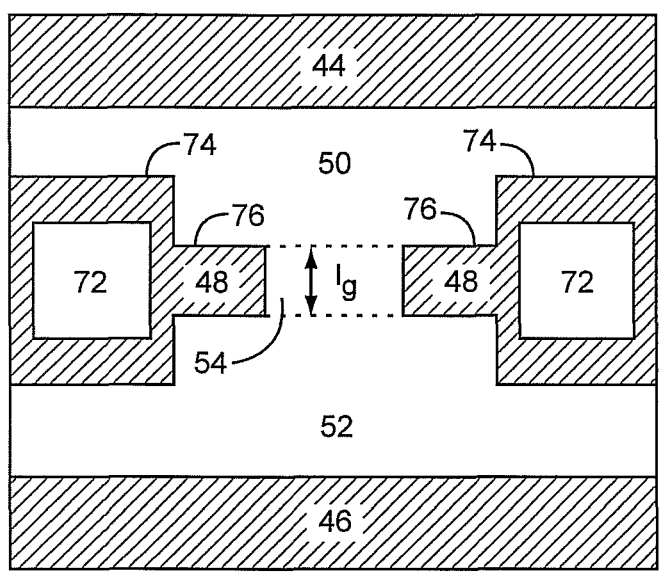
FIG. 17 illustrates the unique configuration of gate contacts according to one embodiment of the present invention.

Yet another configuration of a MESFET device is illustrated in FIG. 17. In this embodiment, assume that design rules limit the size or placement of a metal contact 72, which is formed over the gate contacts 48 and facilitates electrical connections to the gate contacts 48. The metal contact 72 may be positioned on a main body 74 of the gate contact 48, wherein the main body 74 has an extension 76, which resides along the channel region 54. The gate length $l_g$ of the MESFET is a function of the extensions 76 and, in particular, the portions of the extensions 76 that reside along the channel region 54. Regardless of design rules associated with forming metal contacts 72, the extensions 76 may be sized and shaped to provide desired performance characteristics without being limited to the size or shape of the metal contacts 72. Notably, although the gate contacts 48 are shown as being aligned in FIG. 17, the gate contacts 48 may be partially offset or completely offset to further control the actual or effective gate length $l_g$.

Figure 18:
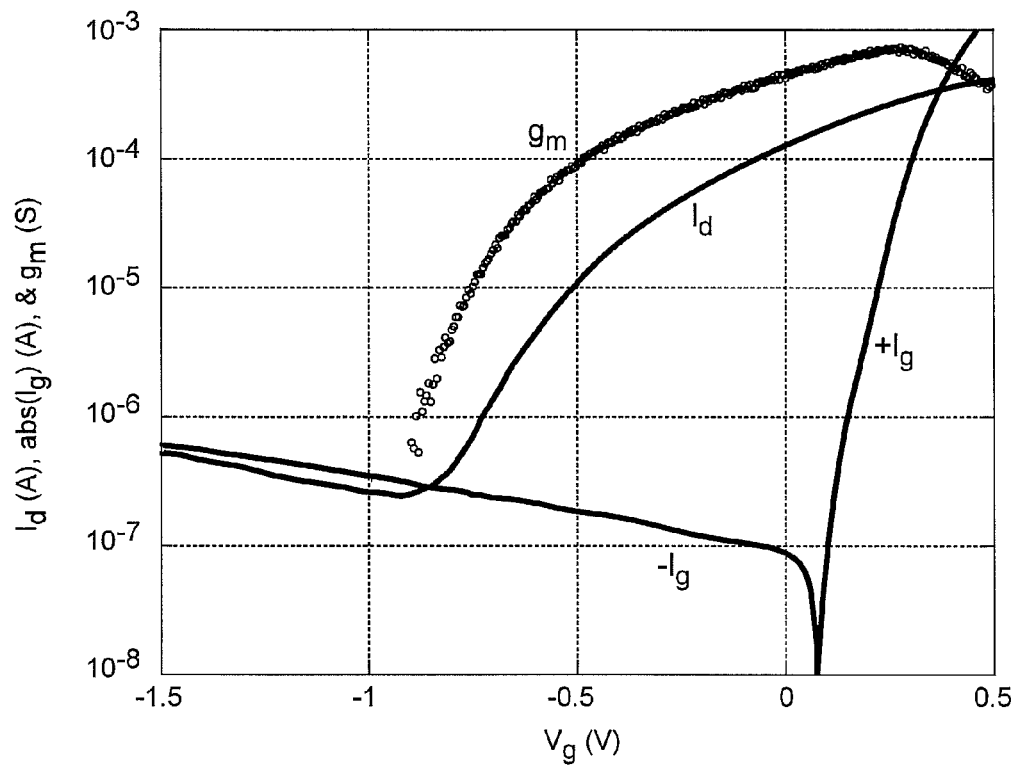
FIG. 18 is a Gummel plot for a particular embodiment of the present invention.

Turning now to FIG. 18, a Gummel plot for an exemplary N-type MESFET device is depicted. In particular, the MESFET device is formed from a MESFET array 60 of 75 MESFET modules 62. Each MESFET module 62 has a gate length $l_g$ of 1.8 microns, a channel width $w_c$ of 0.25 microns, and an effective channel width $ew_c$ of 18.75 microns (0.25 microns× 75 modules). Assuming the applied drain voltage is two volts and the source voltage is zero volts, the illustrated Gummel plot is indicative of the characteristics of the overall MESFET array 60. Notably, a gate current $I_g$ is negative when a gate voltage $V_g$ is less than 0.1 volts and positive when the gate voltage $V_g$ is greater than 0.1 volts. The absolute value of the gate current $I_g$ is plotted. Along with the exemplary gate current $I_g$, exemplary curves for an exemplary drain current $I_d$ and gain $g_m$ are depicted.

Figure 19:
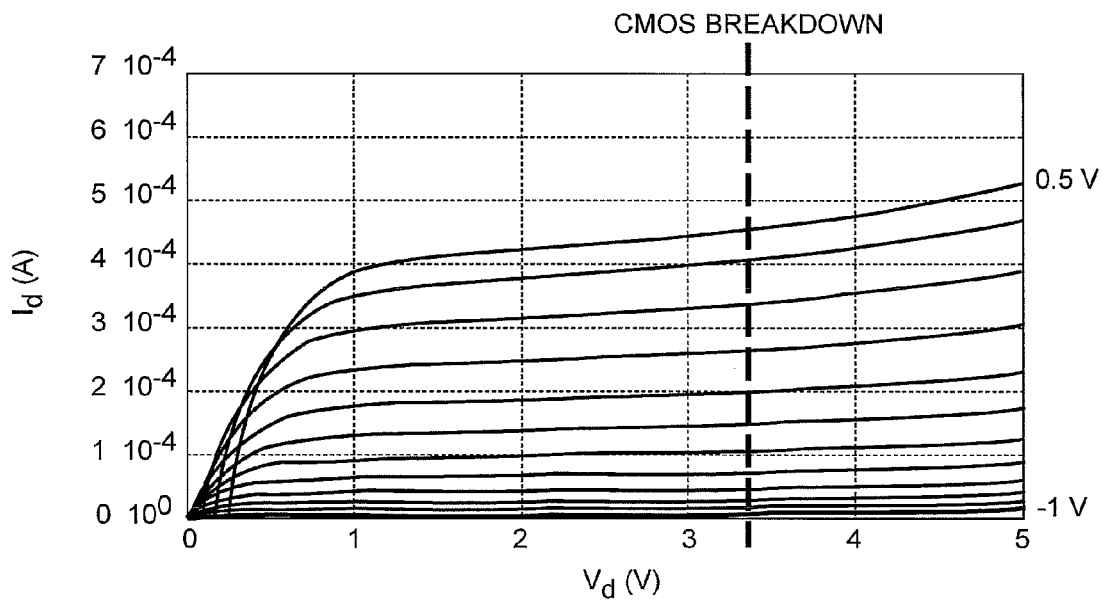
FIG. 19 is a family of curves for an N-type MESFET according to one embodiment of the present invention.
Figure 20:
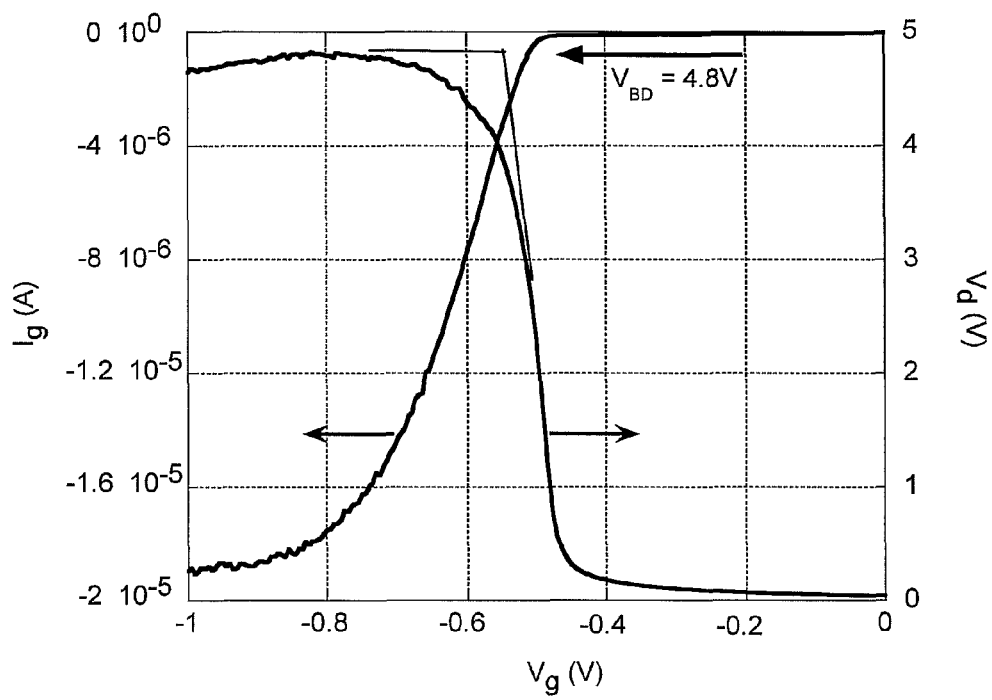
FIG. 20 illustrates a breakdown voltage curve according to one embodiment of the present invention.

FIG. 19 illustrates a family of curves that show the relationship between the drain current $I_d$ and the drain voltage $V_d$ for gate voltages between 0.5 volts and −1 volt in 0.1 volt steps. The CMOS breakdown voltage is also illustrated for this exemplary embodiment. With reference to FIG. 20, a breakdown voltage $V_{BD}$ curve is shown for the exemplary device. In particular, a drain current $I_d$ of 18.75 microamps for 1 mA/mm is used and provides a soft breakdown voltage $V_{BD}$ that equals 4.8 volts.

Figure 21:
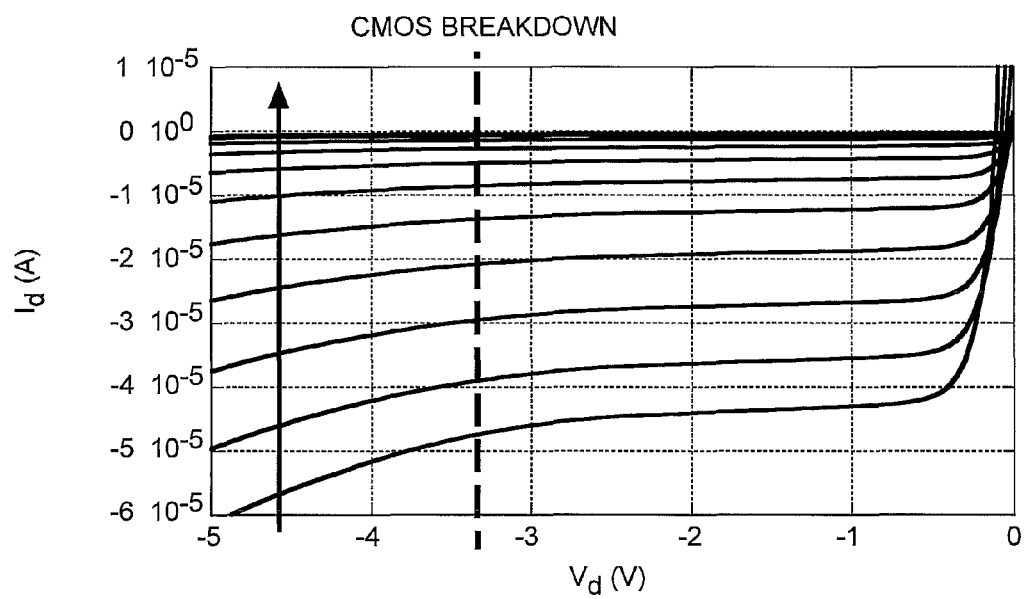
FIG. 21 is a family of curves for a P-type MESFET according to one embodiment of the present invention.

FIG. 21 illustrates a family of curves for a P-type MESFET device having a gate length $l_g$ of 1.8 microns, a channel width $w_c$ of 0.45 microns, and an effective channel width $ew_c$ of 45 microns, assuming there are 100 MESFET modules 62 in a MESFET array 60 of the MESFET device. Notably, the gate voltage applied ranges from −0.25 volts to 0.25 volts in 0.05 volt steps in the direction of the arrow.

Although the above embodiments are implemented in a CMOS process, the MESFET architecture may be implemented in a variety of semiconductor technologies, such as gallium arsenide, gallium nitride, silicon germanium, and the like. Further, the drain, source, and gate contacts 44, 46, and 48 may be formed on or in the source, drain, and channel regions 14, 16, and 12 using any appropriate process or material.

Those skilled in the art will recognize improvements and modifications to the preferred embodiments of the present invention. All such improvements and modifications are considered within the scope of the concepts disclosed herein and the claims that follow.

What is claimed is:

1. A substantially planar semiconductor device comprising:
    a substrate; and
    a device layer residing over the substrate along a first plane and having a first horizontally depleted metal semiconductor field effect transistor comprising:
        a drain region;
        a source region spaced apart from the drain region along the first plane; and
        a gate section residing between the drain region and the source region and comprising a first gate contact and a second gate contact that is spaced apart from the first gate contact along the first plane to provide a channel region between the first gate contact and the second gate contact and extending between the drain region and the source region, wherein when operated, voltages applied to the first gate contact and the second gate contact control vertical depletion regions in either side of the channel region to horizontally deplete the channel region and thus control current flow between the drain region and the source region;
        a drain contact associated with the drain region and a source contact associated with the source region, the drain contact residing along the first plane in the device layer and being spaced apart from the gate section by the drain region and the source contact residing along the first plane in the device layer and being spaced apart from the gate section by the source region; and
        wherein the first gate contact and the second gate contact are substantially surrounded by the source region and the drain region and the channel region.

2. The semiconductor device of claim 1 wherein the source region, the drain region, and the channel region are formed from silicon.

3. The semiconductor device of claim 2 wherein the first gate contact, the second gate contact, the drain contact, and the source contact are formed from a silicide.

4. The semiconductor device of claim 3 wherein the silicide is one of cobalt disilicide and nickel monosilicide.

5. The semiconductor device of claim 1 wherein the first gate contact and the second gate contact provide Schottky gates on either side of the channel region.

6. The semiconductor device of claim 1 wherein the channel region, an inner portion of the drain region that is adjacent the gate section, and an inner portion of the source region that is adjacent the gate section are relatively lightly doped with an N-type or P-type material, and an outer portion of the drain region and an outer portion of the source region are relatively heavily doped with the N-type or P-type material.

7. The semiconductor device of claim 6 wherein:
    the first gate contact and the second gate contact are formed in different portions of the device layer that are relatively lightly doped with the N-type or P-type material;
    the drain contact is adjacent the outer portion of the drain region and the source contact is adjacent the outer portion of the source region; and
    the drain contact and the source contact are formed in different portions of the device layer that are relatively heavily doped with the N-type or P-type material.

8. The semiconductor device of claim 1 wherein the first gate contact and the second gate contact extend at least substantially through the device layer.

9. The semiconductor device of claim 8 wherein:
    the drain contact and the source contact extend at least substantially through the device layer.

10. The semiconductor device of claim 1 wherein the channel region comprises a first side adjacent the first gate contact, a second side adjacent the second gate contact, and a top surface on which a metal oxide semiconductor gate structure is formed, the metal oxide semiconductor gate structure comprising a gate dielectric over the top surface and a gate conductor over the gate dielectric such that when operated, a voltage applied to the gate conductor further controls current flow between the drain region and the source region.

11. The semiconductor device of claim 1 wherein a plurality of horizontally depleted metal semiconductor field effect transistors that are configured like and include the first horizontally depleted metal semiconductor field effect transistor are arranged in an array such that source regions for each of the plurality of horizontally depleted metal semiconductor field effect transistors are contiguous and drain regions for each of the plurality of horizontally depleted metal semiconductor field effect transistors are contiguous.

12. The semiconductor device of claim 11 wherein the first gate contact for one of the plurality of horizontally depleted metal semiconductor field effect transistors is the second gate contact for an adjacent one of the plurality of horizontally depleted metal semiconductor field effect transistors.

13. The semiconductor device of claim 1 wherein the first gate contact and the second gate contact are substantially aligned with one another along opposite sides of the channel region.

14. The semiconductor device of claim 1 wherein the first gate contact and the second gate contact are misaligned and only partially overlap one another along opposite sides of the channel region.

15. The semiconductor device of claim 1 wherein the first gate contact and the second gate contact are completely misaligned and do not overlap one another along opposite sides of the channel region.

16. The semiconductor device of claim 1 wherein the substrate comprises an insulator layer on which the device layer resides.

17. The semiconductor device of claim 1 wherein the substrate is formed from sapphire.

18. The semiconductor device of claim 1 wherein the source region, the drain region, and the channel region are silicon and the first gate contact and the second gate contact are a silicide.

19. The semiconductor device of claim 1 wherein the drain region, the source region, and the channel region comprise a doping agent common to all three regions.

20. The semiconductor device of claim 1 wherein the source contact is attached to the source region.

21. The semiconductor device of claim 1 wherein
the first gate contact comprises a first main body and a first extension, which extends from the first main body and resides along one side of the channel region; and
the second gate contact comprises a second main body and a second extension, which extends from the second main body and resides along an opposing side of the channel region.

* * * * *